(12) United States Patent
Jung

(10) Patent No.: US 12,035,637 B2
(45) Date of Patent: Jul. 9, 2024

(54) SEMICONDUCTOR DEVICE WITH CMOS PROCESS BASED HALL SENSOR AND MANUFACTURING METHOD

(71) Applicant: SK keyfoundry Inc., Cheongju-si (KR)

(72) Inventor: Jungmun Jung, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 251 days.

(21) Appl. No.: 17/522,012

(22) Filed: Nov. 9, 2021

(65) Prior Publication Data

US 2022/0344581 A1 Oct. 27, 2022

(30) Foreign Application Priority Data

Apr. 23, 2021 (KR) .................. 10-2021-0053026

(51) Int. Cl.
*H10N 52/00* (2023.01)
*G01R 33/07* (2006.01)
*H10N 52/01* (2023.01)
*H10N 52/80* (2023.01)

(52) U.S. Cl.
CPC ......... *H10N 52/101* (2023.02); *G01R 33/077* (2013.01); *H10N 52/01* (2023.02); *H10N 52/80* (2023.02)

(58) Field of Classification Search
CPC ...... H10N 52/101; H10N 52/01; H10N 52/80; G01R 33/077
See application file for complete search history.

(56) References Cited

U.S. PATENT DOCUMENTS

| 6,545,462 | B2 | 4/2003 | Schott et al. |
| 7,253,490 | B2 | 8/2007 | Oohira |
| 8,085,035 | B2 | 12/2011 | Namai et al. |
| 9,134,383 | B2 | 9/2015 | Fujita et al. |
| 9,299,919 | B1 | 3/2016 | Lee et al. |
| 10,424,616 | B1 * | 9/2019 | Sun ........................ H10B 61/00 |
| 10,809,318 | B2 | 10/2020 | Lee et al. |
| 2010/0123458 | A1 * | 5/2010 | Schott ..................... G01R 33/06 324/251 |
| 2015/0002140 | A1 * | 1/2015 | Lee ........................ G01R 33/07 324/207.2 |

FOREIGN PATENT DOCUMENTS

| JP | 2015-170650 A | 9/2015 |
| JP | 2020-13907 A | 1/2020 |
| KR | 10-0688584 B1 | 3/2007 |
| KR | 10-2007-0044026 A | 4/2007 |

OTHER PUBLICATIONS

Korean Office Action issued on May 15, 2023, in counterpart Korean Patent Application No. 10-2021-0053026 (6 pages in English, 6 pages in Korean).

* cited by examiner

*Primary Examiner* — Latanya N Crawford Eason

(74) *Attorney, Agent, or Firm* — NSIP Law

(57) ABSTRACT

A semiconductor device including a CMOS process-based Hall sensor is provided. The semiconductor device which may include a N-type sensing region which is formed on a semiconductor substrate; P-type contact regions and N-type contact regions which are alternately formed in the N-type sensing region; a plurality of first trenches which are formed in contact with the P-type contact regions and have a first width; and a plurality of second trenches which separate the P-type contact regions and the N-type contact regions and have a second width less than the first width.

19 Claims, 7 Drawing Sheets

SEMICONDUCTOR DEVICE WITH CMOS PROCESS BASED HALL SENSOR AND MANUFACTURING METHOD

CROSS-REFERENCE TO RELATED APPLICATIONS

This application claims the benefit under 35 USC § 119(a) of Korean Patent Application No. 10-2021-0053026 filed on Apr. 23, 2021 in the Korean Intellectual Property Office, the entire disclosure of which is incorporated herein by reference for all purposes.

BACKGROUND

1. Field

The following description relates to a semiconductor device with a CMOS process-based Hall sensor and a manufacturing method.

2. Description of Related Art

When a magnetic field is applied to a conductor through which a current is flowing, a voltage is generated in a direction perpendicular to the current and the magnetic field. This is called a Hall voltage, and this phenomenon is referred to as a Hall effect.

A magnetic field sensor that uses the Hall effect is referred to as a Hall sensor and may be divided into a horizontal Hall sensor and a vertical Hall sensor in accordance with a magnetic field direction which can be generally detected. The horizontal Hall sensor may detect a magnetic field which is vertical to the surface of the sensor, and the vertical Hall sensor may detect a magnetic field which is parallel to the surface of the sensor.

Typically, the vertical Hall sensor may have a lower sensitivity, a higher offset, and a higher noise characteristic than those of the horizontal Hall sensor.

A typical vertical Hall sensor manufacturing method may reduce a silicon surface concentration between N-type contact regions through which current flows.

This may create, inside the silicon, a path for a current to flow. As the current flows along the thus created path, the sensitivity may be increased, and the offset may be reduced by increasing the length of the path through which the current flows.

However, ion implantation may also be necessary to reduce the silicon surface concentration, or an additional photo process may be provided in order to vary the surface concentration between the N-type contact regions, so that the process may become more complicated. Additionally, it may be difficult to completely block the current flowing through the surface, and a region between the N-type contact regions may not be definitely isolated, so that the N-type contact region may become larger than intended, due to the ion diffusion in the horizontal direction when ions are implanted into the N-type contact region. As a result, the sensitivity may be deteriorated. Additionally, it may be difficult to expect that the offset is sufficiently reduced by the above-described method and the surface-side low concentration region may be significantly affected by a process variation. Accordingly, a big offset characteristic difference may occur even between adjacent vertical Hall sensors which are manufactured together in the same process.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a semiconductor device includes a N-type sensing region disposed on a semiconductor substrate; P-type contact regions and N-type contact regions which are disposed alternately in the N-type sensing region; a plurality of first trenches, which are disposed to be in contact with the P-type contact regions, and are configured to have a first width; and a plurality of second trenches, which are configured to separate the P-type contact regions and the N-type contact regions, and are configured to have a second width less than the first width, wherein a width of each of the N-type contact regions is less than a width of each of the P-type contact regions.

The plurality of N-type contact regions may be disposed to extend outward beyond a first boundary and a second boundary of the N-type sensing region to a surface of the semiconductor substrate.

The semiconductor device may further include one or more dummy contact regions which are disposed on a first outer portion and a second outer portion of the second N-type contact regions.

A depth of the N-type contact regions may be less than a depth of the first trench.

A concentration of the N-type sensing region may be less than a concentration of the N-type contact regions.

The N-type contact regions may be disposed parallel to each other in a straight line on the N-type sensing region.

Each of the P-type contact regions may be configured to have a same width as each other.

A doping concentration of the N-type sensing region may be between $3.0E16/cm^3$ and $4.0E16/cm^3$, and a depth to which the doping concentration is $1.5E15/cm^3$ may be between 2 μm and 5 μm.

A doping concentration of a surface of the N-type sensing region may be between $8.0E15/cm^3$ and $1.5E16/cm^3$, and a depth to which the doping concentration is $1.5E15/cm^3$ may be between 5 μm and 8 μm.

A concentration of a conductive dopant within a preset distance from a first side and a second side with respect to a center of a PN junction formed between the P-type contact region and the N-type sensing region may be equal to or greater than $9.0\ E15/cm^3$.

In a general aspect, a semiconductor device includes a planar Hall sensor and a vertical Hall sensor disposed on a semiconductor substrate, wherein the vertical Hall sensor includes a N-type sensing region disposed on the semiconductor substrate; a plurality of first N-type contact regions disposed in the N-type sensing region; a plurality of P-type contact regions disposed in the N-type sensing region; a plurality of first trenches configured to surround the N-type sensing region; and a plurality of second trenches configured to surround the first N-type contact regions, wherein a width of the second trench is less than a width of the first trench, and wherein a width of N-type contact region is less than a width of the P-type contact region.

The planar Hall sensor may include a N-type sensing region disposed on the semiconductor substrate; a plurality of N-type contact regions disposed in the N-type sensing region; a plurality of P-type contact regions disposed in the N-type sensing region; a plurality of third trenches configured to surround the N-type sensing region; and a plurality of fourth trenches configured to surround each of the N-type contact regions, wherein a width of the N-type contact region is less than a width of the P-type contact region.

The width of the N-type contact region disposed in the planar Hall sensor may be greater than the width of N-type contact region disposed in the vertical Hall sensor.

The vertical Hall sensor may include a first vertical Hall sensor, configured to measure an X-axis magnetic field parallel to a surface of the substrate; and a second vertical Hall sensor, configured to measure a Y-axis magnetic field parallel to the surface of the substrate, wherein the planar Hall sensor is configured to measure a magnetic field perpendicular to the substrate surface, and wherein the first vertical Hall sensor and the second vertical Hall sensor are configured to be disposed adjacent to the planar Hall sensor.

The semiconductor device may further include disposing four or five first N-type contact regions in the N-type sensing region.

The third trench may be disposed to be in contact with the N-type contact region.

In a general aspect, a semiconductor device includes a vertical Hall sensor disposed on a substrate; a planar Hall sensor disposed on the substrate; wherein the vertical Hall sensor includes a plurality of P-type contact regions; a plurality of N-type contact regions; a first dummy contact region and a second dummy contact region respectively disposed at a first end and a second end of the N-type contact regions; wherein a width of each of the N-type contact regions is less than a width of each of the P-type contact regions.

The semiconductor device may further include a plurality of first trenches respectively disposed at a first end of the plurality of P-type contact regions, and a plurality of second trenches disposed to surround each of the plurality of N-type contact regions.

A width of each of the plurality of first trenches may be greater than a width of each of the plurality of second trenches.

A depth of the N-type contact regions is less than a depth of each of the plurality of first trenches.

Other features and aspects will be apparent from the following detailed description, the drawings, and the claims.

Figure 1A:
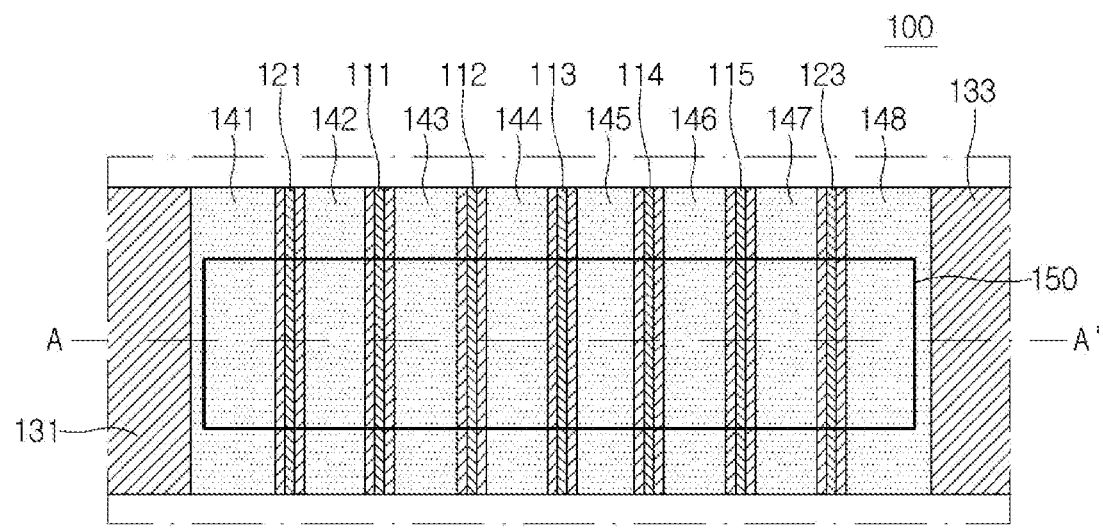
FIGS. 1A and 1B illustrate an example top view and an example cross sectional view of an example CMOS process-based vertical Hall sensor which may be formed in an example semiconductor chip, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of the application, may be omitted for increased clarity and conciseness.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The identification codes (e.g., a, b, c, etc.) in each step are used for convenience of description and do not describe the order of each step. Unless specific orders are explicitly specified by the context, each step may be performed in a different order from the specified order. That is, each step may be performed in the same order as the specified order, may be performed substantially at the same time, or may be performed in a reverse order to the specified order.

Unless otherwise defined, all terms, including technical and scientific terms, used herein have the same meaning as commonly understood by one of ordinary skill in the art to which this disclosure pertains after an understanding of the disclosure of this application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

Also, the terms "first conductive" and "second conductive" refer to opposite conductive such as P-type or N-type. Each of the embodiments described and shown herein may include a complementary embodiment thereof. The one or more examples will be described by exemplifying examples in which the first conductive is a P-type and the second conductive is an N-type.

Unless otherwise defined, all terms used herein have the same meaning as commonly understood by one of ordinary skill in the art. Commonly used terms defined in the dictionary are to be construed to have exactly the same meaning as that of related technology in the context. As long as terms are not clearly defined in the present invention, the terms should not be ideally or excessively construed as formal meaning.

The vertical Hall sensor may have a lower sensitivity than a sensitivity of the planar Hall sensor. Accordingly, in one or more examples, an overall performance of the vertical Hall sensor may be enhanced by improving the offset characteristics of the vertical Hall sensor.

In one or more examples, a doping profile and a structure that improves the offset characteristics of the vertical Hall sensor is provided.

In one or more examples, N-type dummy contact regions may be formed on both sides of a N-type contact region, so that the offset characteristics of the vertical Hall sensor can be improved.

In one or more examples, the end of a terminal in a direction perpendicular to a current flow direction may be formed to pass through the boundary of an N-type well of the vertical Hall sensor, and may be determined outward, thereby reducing a difference in resistance values for each vertical Hall sensor caused by a process variation.

In one or more examples, P-N junctions other than a P-N junction formed with a P-type substrate region around the N-type well inside the silicon may be prevented from being formed, so that a difference in a depletion region caused by the process variation can be minimized.

Hereinafter, one or more examples will be described in detail with reference to the accompanying drawings.

FIG. 1 illustrates an example top view and an example cross sectional view of an example CMOS process-based vertical Hall sensor which can be formed in an example semiconductor chip, in accordance with one or more examples.

Figure 1B:
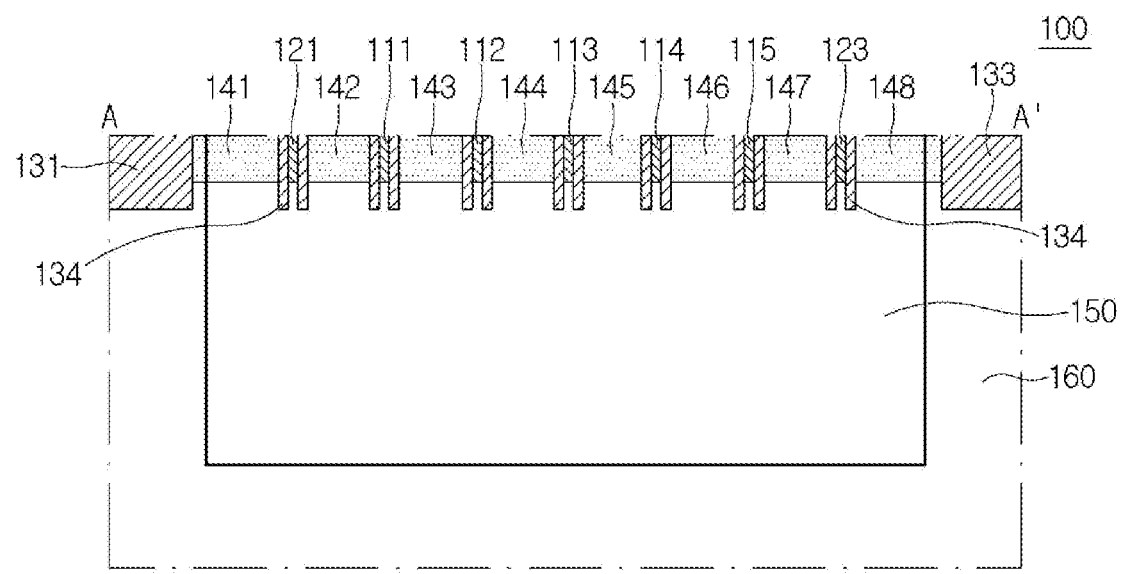

Referring to FIGS. 1A and 1B, the top view of an example CMOS process-based vertical Hall sensor 100 is shown in FIG. 1A, and an example cross sectional view of an example CMOS process-based vertical Hall sensor 100 is shown in FIG. 1B.

Referring to FIGS. 1A and 1B, the CMOS process-based vertical Hall sensor 100 may include a N-type sensing region 150 formed on a first conductive silicon substrate 160, and N-type contact regions 111 to 115 for n number of sensors.

In one or more examples, the CMOS process-based vertical Hall sensor 100 may include N-type dummy contact regions 121 and 123 provided at both ends of the N-type contact regions 111 to 115 for n number of sensors. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

In one or more examples, the CMOS process-based vertical Hall sensor 100 may include P-type contact regions 141 to 148. The P-type contact regions 141 to 148 may be formed by implanting a P-type dopants into the surface of the vertical Hall sensor 100. The P-type contact regions 141 to 148 may prevent a current from flowing along the surface of the first conductive silicon substrate 160. Therefore, this may help the current to flow into the inside of the first conductive silicon substrate 160. The respective N-type contact regions 111 to 115 implemented in a sensor may be respectively formed between the P-type contact regions 141 to 148. As a result, in a non-limiting example, the P-type contact regions 141 to 148 and the N-type contact regions 111 to 115 for a sensor may be alternately formed.

Each of the N-type contact regions 111 to 115 implemented in a sensor may have a width smaller than a width of each of the P-type contact regions 141 to 148. Accordingly, an area occupied by the vertical Hall sensor 100 may be optimized, and the sensitivity may be maximized.

In one or more examples, the vertical Hall sensor 100 may be formed as a part of a semiconductor device. In an example, a plurality of first trenches 131 and 133 may be further included in order to separate the vertical Hall sensor 100 from other semiconductor devices. In one or more examples, the plurality of first trenches 131 and 133 may be formed while contacting the P-type contact regions 141 to 148.

The vertical Hall sensor 100 may include a plurality of second trenches 134 which may surround the N-type contact regions 111 to 115 implemented in a sensor and the N-type dummy contact region 121 and 123. In one or more examples, the width (second width) of the second trench 134 may be smaller than the width (first width) of the first trenches 131 and 133. Accordingly, while maintaining the sensitivity, the area of the CMOS process-based vertical Hall sensor 100 may be reduced, and further, the area of the semiconductor device including the vertical Hall sensor 100 may be minimized.

The N-type contact regions 111 to 115 implemented in a sensor and the N-type dummy contact regions 121 and 123 may be formed by implanting a N-type dopants into the surface of the first conductive silicon substrate 160. Accordingly, the N-type dummy contact regions 121 and 123 and the N-type contact regions 111 to 115 may be simultaneously formed. Therefore, all of the contact regions 111 to 115 may be represented by N+. The dummy contact regions 121 and 123 may not be electrically connected to the contact regions 111 to 115.

The dummy contact regions 121 and 123 provided at both ends of the contact regions 111 to 115 may reduce asymmetric properties due to the structural limit of the vertical Hall sensor 100, and may provide an offset improvement effect by increasing the uniformity of the manufacturing process with regard to the contact regions 111 and 115 at the side of the contact regions 112 to 114.

Additionally, the contact regions 111 to 115 and the dummy contact regions 121 and 123 may be separated from other regions by the plurality of trenches. If they are not separated from other regions, junctions may be formed between those other regions and the contact regions, which may cause the deterioration of offset characteristic.

Referring to FIG. 1A, the contact regions 111 to 115, the dummy contact regions 121 and 123, and the P-type contact regions 141 to 148 may be formed to extend outward beyond the boundary of the N-type sensing region 150. Accordingly, a variation in resistance values caused by a process variation may be reduced.

In one or more examples, when two or more dummy contact regions are positioned on one side of the contact regions 111 to 115, the distance between the dummy contact regions may be equal to the distance between the contact regions 111 to 115.

In one or more examples, when the distance between the contact regions 111 to 115 is not constant and is determined according to a particular rule, the distance between the dummy contact regions 121 and 123 and the outermost N-type contact region may also be determined according to the particular rule. Additionally, when a plurality of N-type dummy contact regions are formed outside the outermost N-type contact region, the distance between the plurality of N-type dummy contact regions may also be determined according to the particular rule.

Referring to the example cross sectional view as illustrated in FIG. 1B, each depth of the N-type contact regions 111 to 115, the dummy contact region 121 and 123, and the P-type contact regions 141 to 148 may be smaller than or equal to depths of the plurality of the trenches 131, 133, and 134.

Referring to the example cross sectional view as illustrated in FIG. 1B, a PN junction may be formed between the first conductive silicon substrate 160 and the N-type sensing region 150. Additionally, it may be beneficial if a P-type well region does not exist around the N-type sensing region 150. When the P-type well region (not shown) exists around the N-type sensing region 150, a difference in a depletion region caused by the process variation may occur. This may deteriorate the dispersion of generated resistance values, so that the offset characteristics may be degraded.

The one or more example vertical Hall sensor may be one semiconductor device and may form one semiconductor chip together with other semiconductor devices by implementing the CMOS process.

In one or more examples, the example semiconductor device may include: the N-type sensing region 150 which is formed on a semiconductor substrate 160; the P-type contact regions 141-148 and the N-type contact regions 111-115 which may be formed alternately in the N-type sensing region 150; the plurality of first trenches 131 and 133 which may be formed in contact with the P-type contact regions 141 to 148 and may have a first width; and the plurality of second trenches 134 which may separate the P-type contact regions 141-148 and the N-type contact regions 111-115 and may have a second width which is less than the first width. The width of each of the N-type contact regions 111-115 may be less than the width of each of the P-type contact regions 141-148.

In one or more examples, a plurality of the N-type contact regions 111-115 may be formed to extend outward beyond both boundaries of the N-type sensing region 150 to the surface of the semiconductor substrate 160.

In one or more examples, the semiconductor device may further include second N-type dummy contact regions 121 and 123 which may be formed on both outer portions of the N-type contact regions 111-115.

In one or more examples, depths of the N-type contact regions 111-115 may be less than a depth of the first trench 131 or the second trench 133.

In one or more examples, the N-type contact regions 111-115 may be formed parallel to each other in a straight line on the N-type sensing region 150.

In one or more examples, each of the P-type contact regions 141-148 may have the same width as each other.

In one or more examples, a doping concentration of the N-type sensing region 150 may be between $3.0E16/cm^3$ and $4.0E16/cm^3$, and a depth of the N-type sensing region 150 to which the doping concentration is $1.5E15/cm^3$ may be between 2 μm and 5 μm.

The doping concentration at a top surface of the N-type sensing region 150 may be between $8.0E15/cm^3$ and $1.5E16/cm^3$, and a depth of the N-type sensing region 150 to which the doping concentration is $1.5E15/cm^3$ may be between 5 μm and 8 μm.

Figure 2:
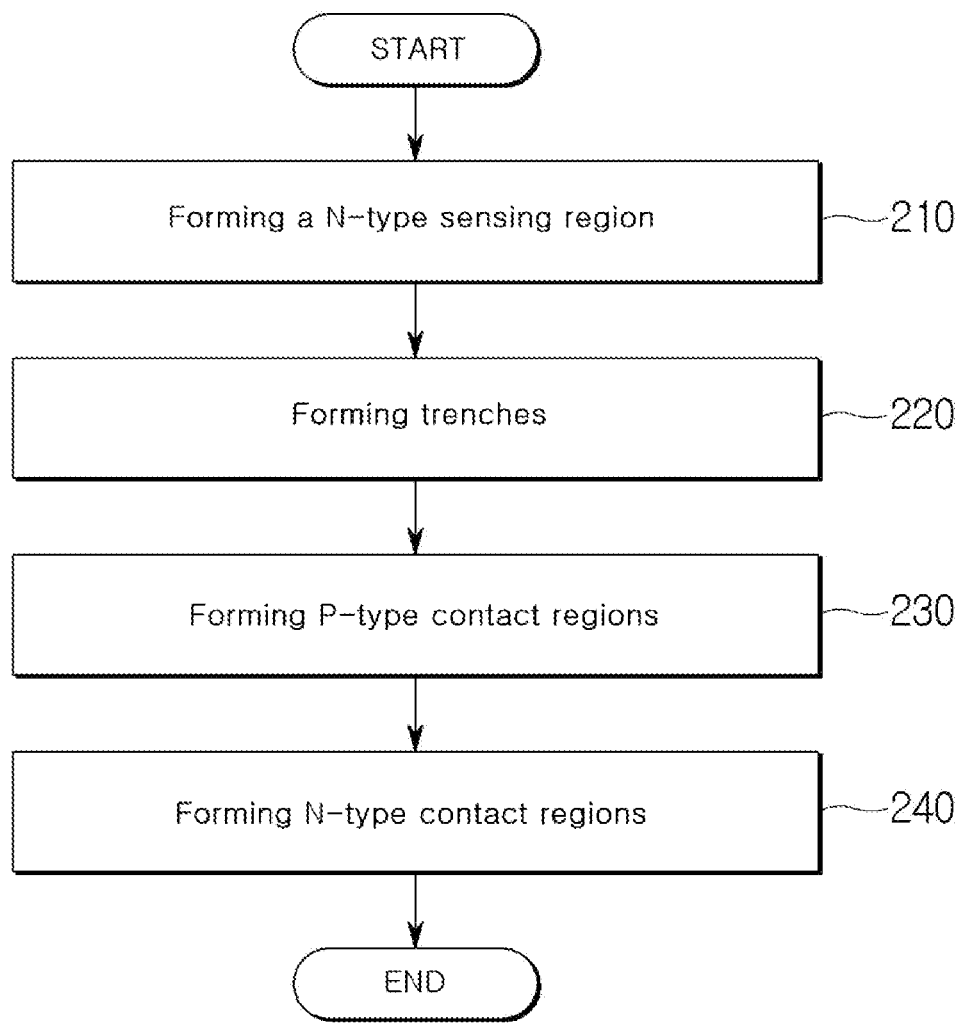
FIG. 2 is a flowchart illustrating an example semiconductor device manufacturing method including an example CMOS process-based vertical Hall sensor, in accordance with one or more embodiments.

FIG. 2 is a flowchart illustrating a semiconductor device manufacturing method including an example CMOS process-based vertical Hall sensor, in accordance with one or more embodiments.

FIGS. 3A-3D illustrate a semiconductor device manufacturing method including an example CMOS process-based vertical Hall sensor, in accordance with one or more embodiments.

Referring to FIG. 2, in operation 210, the N-type sensing region 150 may be formed within the first conductive silicon substrate 160. In a non-limiting example, the N-type sensing region 150 may be formed by implanting high energy second conductive ions into the first conductive silicon substrate 160, and performing a drive-in process to diffuse the second conductive ions into the inside of the first conductive silicon substrate 160.

Figure 3A:
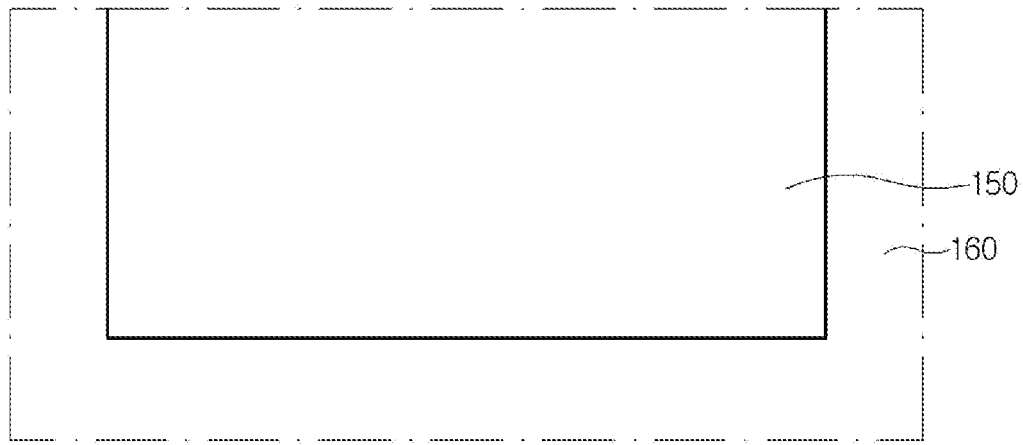
FIGS. 3A to 3D illustrate an example semiconductor device manufacturing method including an example CMOS process-based vertical Hall sensor, in accordance with one or more embodiments.

In accordance with one or more examples, the process of implanting the second conductive ions may be performed one or more times, and the plurality of processes of implanting the second conductive ions may be completed before performing the drive-in process. The drive-in process may be performed at a high temperature of 1,000° C. or higher after the process of implanting the second conductive ions, the N-type sensing region 150 may be, as illustrated in FIG. 3A, formed within the first conductive silicon substrate 160.

If the depth of the formed N-type sensing region 150 is increased, and the doping concentration of the N-type sensing region 150 is kept low, the sensitivity characteristics of the vertical Hall sensor may be improved.

Therefore, in one or more examples, the N-type sensing region 150 may be formed such that the surface doping concentration is between $3.0E16/cm^3$ and $4.0E16/cm^3$ and the depth to which the concentration of the N-type doping is about $1.5E15/cm^3$ is between 2 μm and 5 μm. Alternatively, in one or more examples, the N-type sensing region 150 may be formed such that the surface doping concentration is between $8.0E16/cm^3$ and $1.5E16/cm^3$ and the depth to which the concentration of the N-type doping is about $1.5E15/cm^3$ is between 5 μm and 8 ρm. Here, Ek represents $10^k$. In an example, E16 represents $10^{16}$.

In operation 220, the plurality of trenches may be formed. The plurality of trenches may include the plurality of first trenches 131 and 133 which are positioned at the outermost portion of the example vertical Hall sensor in order to separate the vertical Hall sensor 100 from other devices within the semiconductor chip, and may include the plurality of second trenches 134, which are positioned to separate the N-type contact regions 111 to 115 and the N-type dummy contact regions 121 and 123 from their surroundings.

Figure 3B:
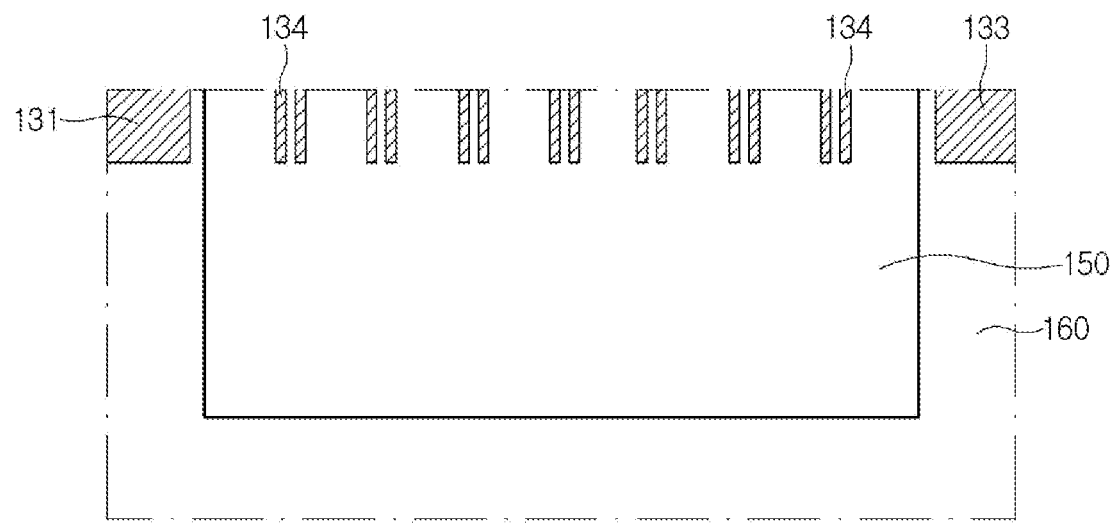

In the process of forming the plurality of trenches, any one single film selected from the group consisting of an oxide film, a nitride film, an oxynitride (SiON) film, and a carbon containing film or a multilayer film formed by stacking the single films may be deposited on the first conductive silicon substrate 160 or the N-type sensing region 150. Then, a photoresist film may be applied, and may then be patterned through exposure and development processes, thereby masking the remaining portions other than a portion where the trench is formed. Subsequently, when the single film or the multilayer film is sequentially etched, the remaining portions other than the portion masked by the patterned photoresist film may be etched to form the plurality of trenches. Then, the photoresist film, which is used for masking, may be removed by, as non-limiting examples, an ashing or stripping process. As a result of operation 220, the plurality of trenches 131, 133, and 134 may be formed as shown in FIG. 3B.

Figure 3C:
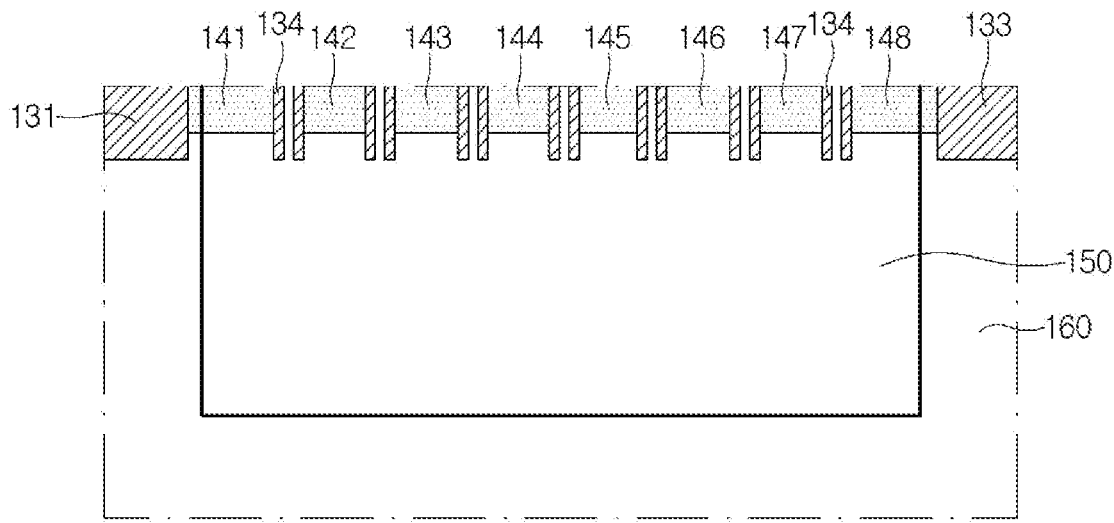

In operation 230, in order to prevent a current from flowing along the surface of the first conductive silicon substrate 160, a plurality of P-type contact regions 141 to 148 may be, as shown in FIG. 3C, formed by implanting the P-type dopants used in the CMOS process.

The depths of the doped regions 141 to 148 may be smaller than or equal to the depths of the plurality of first and second trenches 131, 133, and 134 formed in step 220.

Figure 3D:
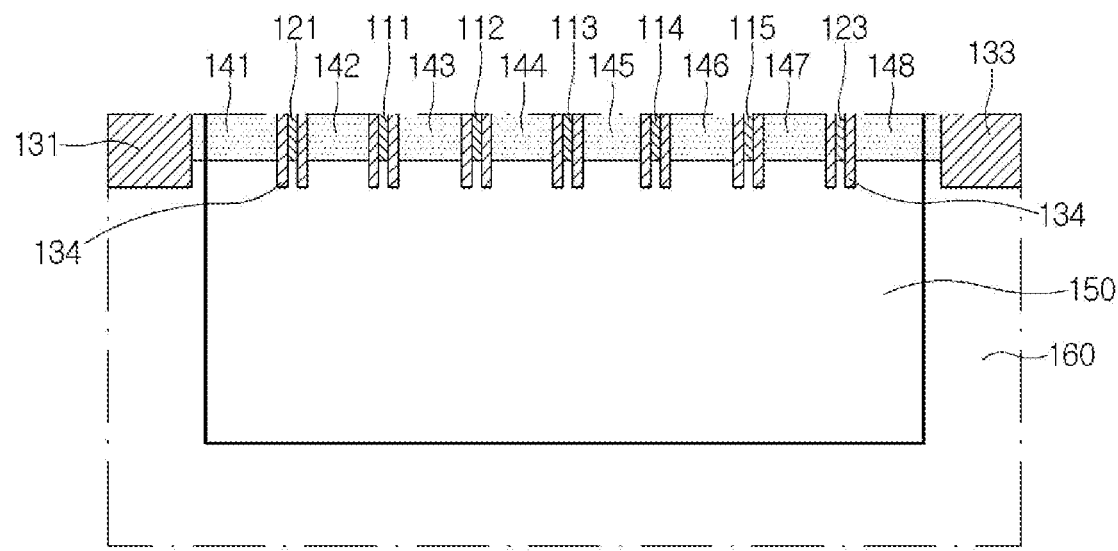

In operation 240, in order to form the N-type contact region and the N-type dummy contact regions, the N-type dopants may be implanted into the regions between the plurality of second trenches 134. Accordingly, as shown in FIG. 3D, a plurality of N-type contact regions 111 to 115 and one or more N-type dummy contact regions 121 and 123 may be formed.

The depth of each contact region may be smaller than or equal to the depths of the plurality of first and second trenches 131, 133, and 134 formed in operation 220.

Operations 230 and 240 may be also performed in reverse order. That is, in one or more examples, operation 230 may be performed first and then operation 240 may be performed, or alternatively, in accordance with one of more examples, operation 240 may be performed first and then operation 230 may be performed.

The plurality of trenches, doped regions, N-type contact regions and N-type dummy contact regions formed in operations 220, 230, and 240 may be, as illustrated in FIGS. 1A and 1B, formed to extend outward beyond the boundary of the N-type sensing region 150. Accordingly, a difference in resistance values for each vertical Hall sensor caused by the process variation may be reduced.

Figure 4:
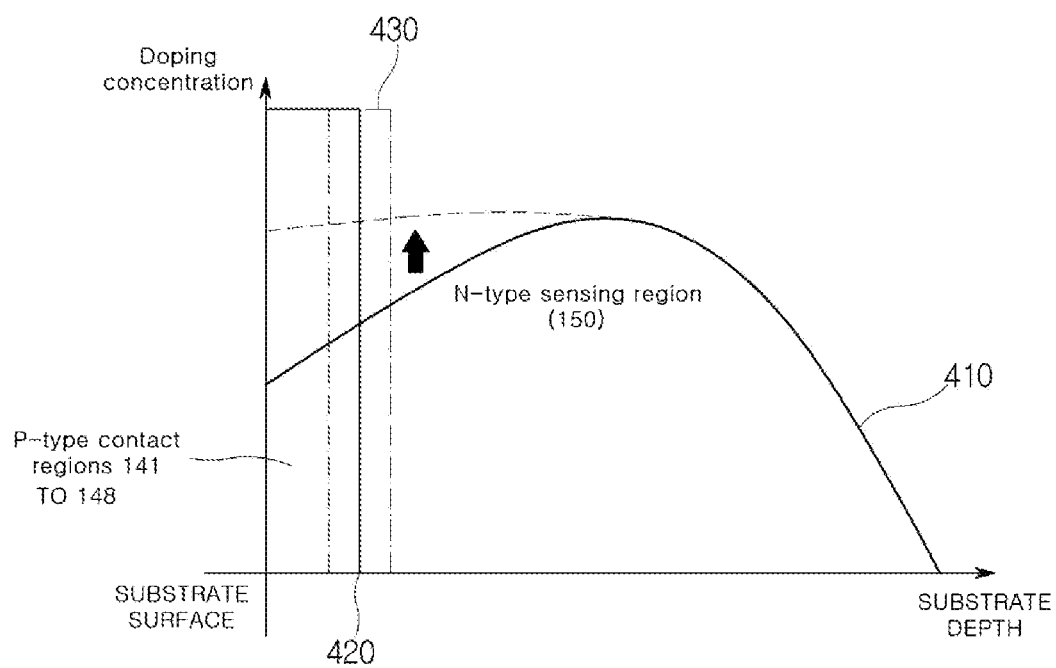
FIG. 4 illustrates an example of a N-type doping concentration according to a depth in an example semiconductor device, in accordance with one or more embodiments.

FIG. 4 illustrates an example of a N-type doping concentration according to the depth in an example semiconductor device, in accordance with one or more embodiments.

Referring to FIG. 4, the amount of the N-type dopants implanted into the substrate may be adjusted such that the N-type doping concentration of a certain region 430 is $9.0E15/cm^3$ or more on the basis of a central portion 420 of the PN junction. In one or more examples, the N-type doping concentration at a top surface of N-type contacts regions 111-115 may be between $3.0E16/cm^3$ and $4.0E16/cm^3$, and a depth to which the N-type doping concentration is about $1.5E15/cm^3$ may be between 2 μm and 5 μm. Alternatively, in one or more examples, the N-type doping concentration at a top surface of N-type contacts regions 111-115 between $8.0E15/cm^3$ and $1.5E16/cm^3$, and a depth to which the N-type doping concentration is about $1.5E15/cm^3$ may be between 5 μm and 8 μm.

Referring to the above descriptions, the vertical Hall sensor manufacturing method, in accordance with one or more embodiments, may include: forming the N-type sensing region in a first conductive substrate; forming the trench that separates a sensing contact region from the surrounding environment; forming the doped region by implanting the first conductive dopant between the sensing contact regions; forming the plurality of the N-type contact regions and one or more one N-type dummy contact regions by implanting the N-type doping into the sensing contact region. The plurality of the N-type contact regions may be formed parallel to each other in a straight line on the first conductive substrate and on the surface of the N-type sensing region. The one or more N-type dummy contact regions may be formed in a straight line respectively on both outer portions of the N-type contact region group which includes the plurality of N-type contact regions in such a manner as to be parallel to the plurality of N-type contact regions.

In one or more examples, the plurality of N-type contact regions and the at least one N-type dummy contact region may be formed to extend outward beyond both boundaries on the surface of the N-type sensing region to the surface of the first conductive substrate.

In one or more examples, the forming of the trench that separates the contact region from the surroundings may further include forming a trench that separates the vertical Hall sensor from the surrounding environment.

In one or more examples, the forming of the doped region may include forming the doped region such that the depth of the doped region is smaller than or equal to the depth of the trench.

In one or more examples, the forming of the plurality of the N-type contact regions and the one or more one N-type dummy contact regions by implanting the N-type doping into the contact region, may include forming the plurality of the N-type contact regions and the one or more one N-type dummy contact regions by implanting the N-type doping into the contact region such that the depth of the N-type doping implanted into the contact region is smaller than or equal to the depth of the trench.

In one or more examples, the forming of the trench that separates the contact region from the surrounding environment may include forming the trench such that the distances between the contact regions are equal to each other.

In one or more examples, the forming of the trench that separates the contact region from the surrounding environment may include forming the trench such that the distances between the contact regions are determined based on predetermined rules.

In one or more examples, the forming of the N-type sensing region in a first conductive substrate may include implanting a high energy N-type doping into the first conductive substrate and performing the drive-in process at a high temperature of 1,000° C. or higher.

In one or more examples, the forming of the N-type sensing region in a first conductive substrate may include forming the N-type sensing region such that the doping concentration of the surface of the N-type sensing region is between $3.0E16/cm^3$ and $4.0E16/cm^3$ and a depth to which the doping concentration is $1.5E15/cm^3$ may be between 2 μm and 5 μm.

In one or more examples, the forming of the N-type sensing region in a first conductive substrate may include forming the N-type sensing region such that the doping concentration of the surface of the N-type sensing region is between $8.0E15/cm^3$ and $1.5E16/cm^3$ and a depth to which the doping concentration is $1.5E15/cm^3$ may be between 5 μm and 8 μm.

In one or more examples, the forming of the doped region may include forming the doped region such that a concentration of the N-type doping within a preset distance from both sides with respect to the center of a PN junction formed between the P-type contact regions and the N-type sensing region is $9.0 \, E15/cm^3$ or more.

Figure 5:
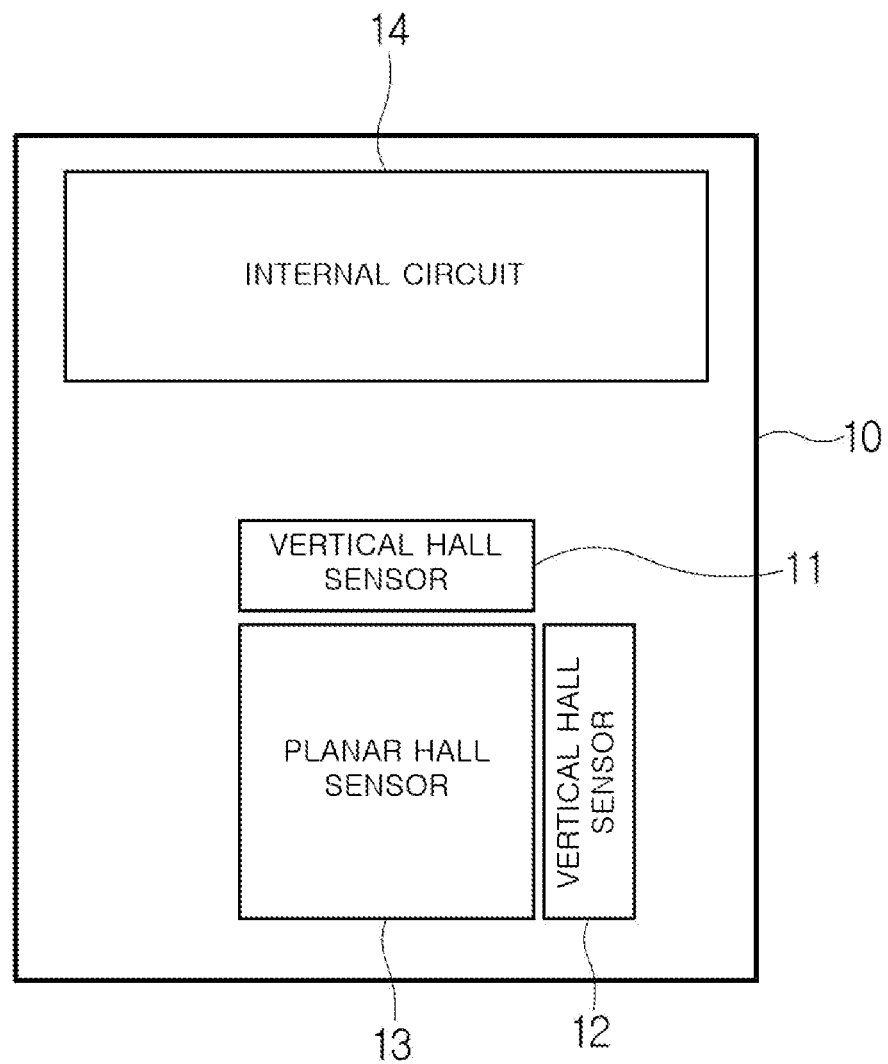
FIG. 5 illustrates an example of forming a three-dimensional sensor by implementing an example semiconductor device including an example CMOS process-based planar Hall sensor and an example CMOS process-based vertical Hall sensor, in accordance with one or more embodiments.

FIG. 5 illustrates an example of forming an example three-dimensional sensor by implementing the semiconductor device including a CMOS process-based planar Hall sensor and the CMOS process-based vertical Hall sensor, in accordance with one or more embodiments.

As illustrated in FIG. 5, the CMOS process-based vertical Hall sensor (X-axis vertical Hall sensor) 11 that measures an X-axis magnetic field parallel to the surface of the sensor, the CMOS process-based vertical Hall sensor (Y-axis vertical Hall sensor) 12 that measures a Y-axis magnetic field parallel to the surface of the sensor, and a CMOS process-based planar Hall sensor 13 that measures a magnetic field perpendicular to the surface of the sensor, are provided on a semiconductor chip 10, so that a magnetic field may be measured in three X, Y and Z axial directions. An internal circuit 14 may be additionally formed or disposed in the semiconductor chip 10. The internal circuit 14 may control the Hall sensors in the three-axial directions to measure a magnetic field, may generate a signal based on the measured magnetic field and may transmit the signal to a processor, and the like. In a non-limited example, a 3D sensor or a joystick may be implemented by using the thus formed sensor configuration.

FIG. 6 is an example cross sectional view of an example semiconductor device including the CMOS process-based vertical Hall sensor (VHS) and the CMOS process-based planar Hall sensor (PHS), in accordance with one or more embodiments.

Figure 6A:
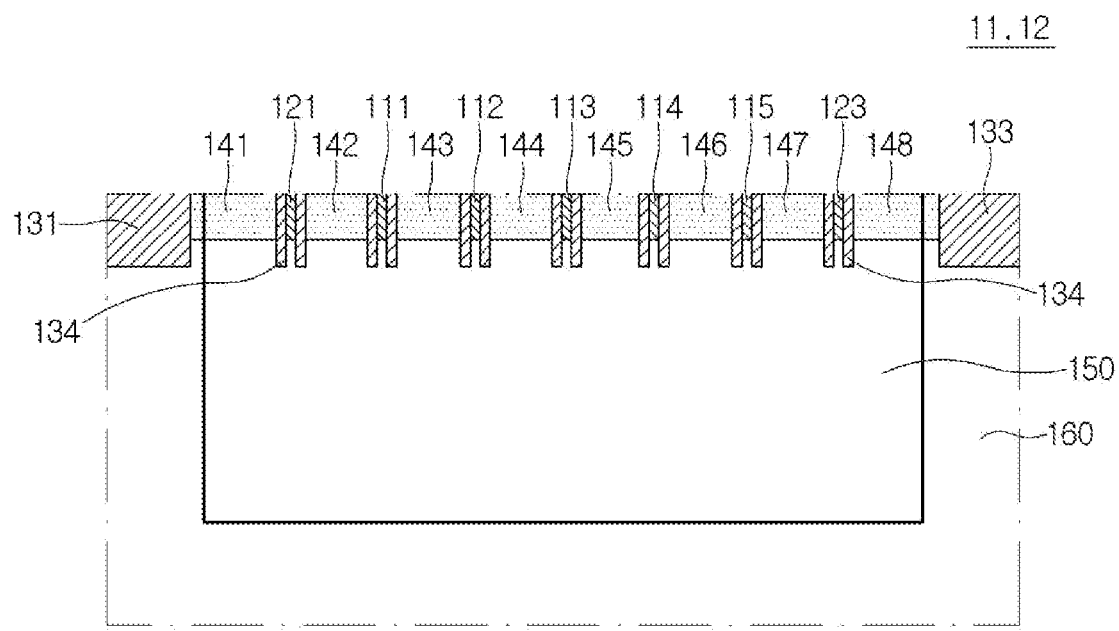
FIGS. 6A and 6B illustrate an example cross sectional view of an example semiconductor device including an example CMOS process-based vertical Hall sensor (VHS) and an example CMOS process-based planar Hall sensor (PHS), in accordance with one or more embodiments.

In one or more examples, referring to FIG. 6A, in the example CMOS process-based vertical Hall sensors 11 and 12, a N-type sensing region 150 may be formed on a semiconductor substrate 160. The N-type sensing region 150 may include a plurality of first P-type contact regions 141 to 148 and a plurality of first N-type contact regions 111 to 115 which may be doped at a high concentration. The plurality of first N-type contact regions 111 to 115 and the plurality of first P-type contact regions 141 to 148 may be alternately formed.

The plurality of trenches 131, 133, and 134 may be formed in the surface of the substrate 160. In an example, the plurality of first trenches 131 and 133 may be disposed to surround the N-type sensing region 150. Additionally, the first trenches 131 and 133 may be formed in contact with the first P-type contact regions 141 and 148.

Additionally, the plurality of second trenches 134 may be disposed to surround each of the first N-type contact regions 111 to 115. Each of the first N-type contact regions 111 to 115 may be surrounded by the plurality of second trenches 134. In one or more examples, the first width of the first trenches 131 and 133 may be greater than the second width of the second trench 134.

Additionally, the plurality of first P-type contact regions 141-148 may be formed between the first N-type contact regions 111 to 115. In one or more examples, the widths of the first P-type contact regions 141-148 may be the same. Accordingly, the distances between the first N-type contact regions 111 to 115 may be equal to each other.

The first P-type contact region 141 formed on the surface of the substrate 160 may be advantageous in minimizing a noise component generated by the surface of the substrate 160. A width of the first N-type contact regions 111 to 115 is less than a width of the first P-type contact region 141.

Figure 6B:
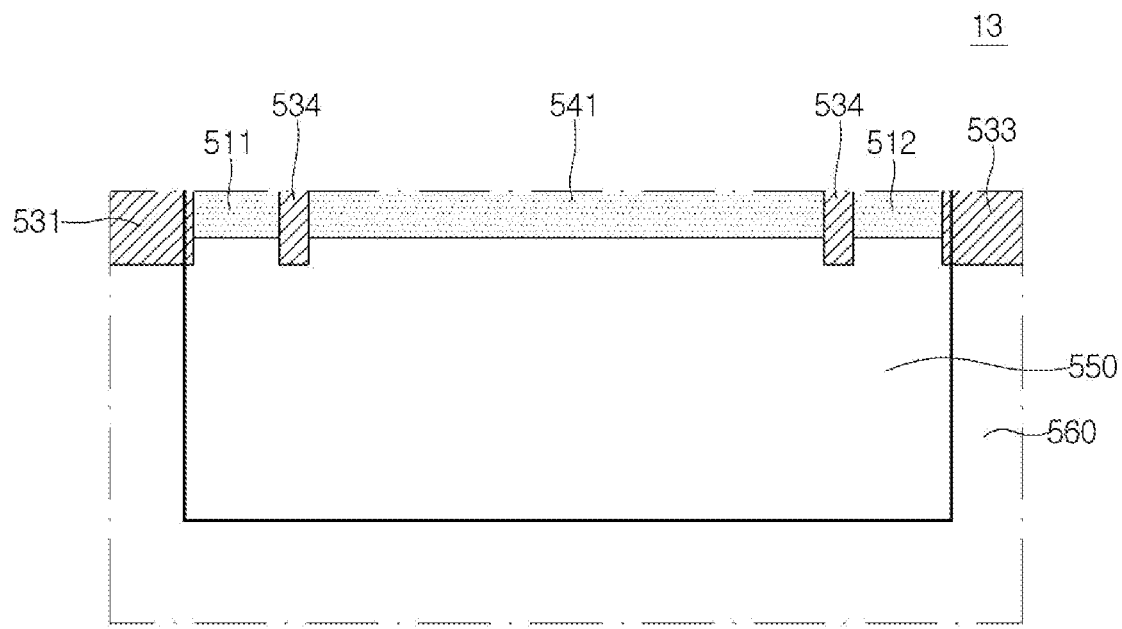

Referring to FIG. 6B, in the CMOS process-based planar Hall sensor (PHS) 13, a N-type sensing region 550 may be formed on a semiconductor substrate 560. The N-type sensing region 550 may include a second P-type contact region 541 and second N-type contact regions 511 and 512 which may be doped at a high concentration.

A plurality of trenches 531, 533, and 534 may be formed in the surface of the substrate 560. In one or more examples, the plurality of third trenches 531 and 533 may be disposed to surround the N-type sensing region 550. The plurality of third trenches 531 and 533 may be formed in contact with the second N-type contact regions 511 and 512.

Additionally, the plurality of fourth trenches 534 may be disposed to electrically separate each of the second N-type contact regions 511 and 512 from the second P-type contact region 541. The fourth trench 534 may be formed between the second N-type contact regions 511 and 512 and the second P-type contact region 541. In one or more examples, the third width of the third trenches 531 and 533 may be slightly greater than the fourth width of the fourth trench 534.

The second heavily doped P-type region 541 may be formed between the plurality of second heavily doped N-type regions 511 and 512. The second heavily doped P-type region 541 formed on the surface of the substrate 560 may be advantageous in minimizing a noise component generated by the surface of the substrate 560. A width of the second heavily doped N-type region 511 and 512 may be smaller than a width of the second heavily doped P-type region 541.

Additionally, in FIG. 6B, the width of the second N-type contact regions 511 and 512 of the planar Hall sensor 13 may be at least three times longer than the width of the first N-type contact regions 111 to 115 of the vertical Hall sensor 11. In other words, the width of the first N-type contact regions 111 to 115 of the vertical Hall sensors 11 and 12 may be formed to be much less than the width of the second N-type contact regions 511 and 512 of the planar Hall sensor 13. This may increase sensitivity by securing more current.

Based on the above description, the example semiconductor device, in accordance with one or more embodiments, may include the planar Hall sensor 13 and the vertical Hall sensors 11 and 12 which may be formed on the semiconductor substrate 160. The vertical Hall sensors 11 and 12 may include: the N-type sensing region 150 formed on the semiconductor substrate 160, the plurality of first N-type contact regions 111 to 115 formed in the N-type sensing region 150, the plurality of P-type contact regions 141 to 148 formed in the N-type sensing region 150, the plurality of first trenches 131 and 133 which surround the N-type sensing region 150, and the plurality of second trenches 134 which surround each of the first N-type contact regions 111 to 115. The width of the second trench 134 may be formed less than the width of the first trench 131.

In one or more examples, the planar Hall sensor 13 may include: the N-type sensing region 550 formed on the semiconductor substrate 560, the N-type contact regions 511 and 512 formed in the N-type sensing region 550, the plurality of P-type contact region 541 formed in the N-type sensing region 550, the plurality of third trenches 531 and 533 which surround the N-type sensing region 550, and the plurality of fourth trenches 534 which surround each of the N-type contact regions 511 and 512. The width of the N-type contact region 511 and 512 may be formed to be less than the width of the P-type contact region 541.

In one or more examples, the width of the N-type contact regions 511 and 512 formed in the planar Hall sensor 13 may be formed to be greater than the width of the first N-type contact regions 111 to 115 formed in the vertical Hall sensor 11 and 12.

In one or more examples, the vertical Hall sensors 11 and 12 may include a first vertical Hall sensor that measures an X-axis magnetic field parallel to the substrate surface, and a second vertical Hall sensor that measures a Y-axis magnetic field parallel to the substrate surface. The planar Hall sensor 13 may measure a magnetic field perpendicular to the substrate surface. In a non-limiting example, the first and second vertical Hall sensors 11 and 12 may be disposed in the vicinity of the planar Hall sensor 13, respectively.

In one or more examples, with regard to the plurality of first N-type contact regions 111 to 115, there may be provided four or five first N-type contact regions 111 to 115.

In one or more examples, the third trench 534 may be formed in contact with the N-type contact regions 511 and 512.

While the present invention has been described with reference to one or more examples thereof, it will be understood by those skilled in the art that various changes and modification in forms and details may be made without departing from the spirit and scope of the one or more examples.

The one or more examples describe the vertical Hall sensor which has a structure that minimizes an offset variation, etc., which may be caused by a process variation of the vertical Hall sensor. As a result, it is possible to improve the accuracy in the measurement of the magnetic field parallel to the surface of the sensor on the basis of the vertical Hall sensor proposed in the one or more examples.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
a N-type sensing region disposed on a semiconductor substrate;
P-type contact regions and N-type contact regions which are disposed alternately in the N-type sensing region;
at least one first trench, disposed adjacent to at least one of the P-type contact regions, and configured to have a first width; and
a plurality of second trenches, which are configured to separate each of the P-type contact regions and each of the N-type contact regions, and are configured to have a second width less than the first width of the at least one first trench,
wherein a width of each of the N-type contact regions is less than a width of each of the P-type contact regions, and
wherein each of the P-type contact regions is configured to have a same width as each other.

2. The semiconductor device of claim 1, wherein each of the N-type contact regions is disposed to extend outward beyond a first boundary and a second boundary of the N-type sensing region to a surface of the semiconductor substrate.

3. The semiconductor device of claim 1, further comprising one or more dummy contact regions which are disposed on at least one of a first outer portion and a second outer portion of at least one of the N-type contact regions.

4. The semiconductor device of claim 1, wherein a depth of each of the N-type contact regions is less than a depth of the at least one first trench.

5. The semiconductor device of claim 1, wherein a doping concentration of the N-type sensing region is less than a doping concentration of each of the N-type contact regions.

6. The semiconductor device of claim 1, wherein each of the N-type contact regions is disposed parallel to each other in a straight line on the N-type sensing region.

7. The semiconductor device of claim 1, wherein a doping concentration of the N-type sensing region is between $3.0E16/cm^3$ and $4.0E16/cm^3$, and a depth to which the doping concentration is $1.5E15/cm^3$ is between 2 μm and 5 μm.

8. The semiconductor device of claim 1, wherein a doping concentration of a surface of the N-type sensing region is between $8.0E15/cm^3$ and $1.5E16/cm^3$, and a depth to which the doping concentration is $1.5E15/cm^3$ is between 5 μm and 8 μm.

9. The semiconductor device of claim 1, wherein a doping concentration of a conductive dopant within a preset distance from a first side and a second side with respect to a center of a PN junction formed between the P-type contact region and the N-type sensing region is equal to or greater than $9.0 E15/cm^3$.

10. A semiconductor device, comprising:
a planar Hall sensor and a vertical Hall sensor disposed on a semiconductor substrate,
wherein the vertical Hall sensor comprises:
a first N-type sensing region disposed on the semiconductor substrate;
one or more first N-type contact regions disposed in the first N-type sensing region;
a plurality of first P-type contact regions disposed in the first N-type sensing region;
a plurality of first trenches configured to surround the first N-type sensing region; and
a plurality of second trenches configured to surround each of the one or more first N-type contact regions,
wherein a width of each of the plurality of second trenches is less than a width of each of the plurality of first trenches,
wherein a width of each of the one or more first N-type contact regions is less than a width of each of the plurality of first P-type contact regions, and
wherein each of the plurality of first P-type contact regions is configured to have a same width as each other.

11. The semiconductor device of claim 10, wherein the planar Hall sensor comprises:

a second N-type sensing region disposed on the semiconductor substrate;
one or more second N-type contact regions disposed in the second N-type sensing region;
a second P-type contact region disposed in the second N-type sensing region;
a plurality of third trenches configured to surround the second N-type sensing region; and
a plurality of fourth trenches configured to surround each of the one or more second N-type contact regions,
wherein a width of each of the one or more second N-type contact regions is less than a width of the second P-type contact region.

12. The semiconductor device of claim 11, wherein the width of the one or more second N-type contact regions disposed in the planar Hall sensor is greater than the width of the one or more first N-type contact regions disposed in the vertical Hall sensor.

13. The semiconductor device of claim 10, wherein the vertical Hall sensor comprises:
a first vertical Hall sensor, configured to measure an X-axis magnetic field parallel to a surface of the substrate; and
a second vertical Hall sensor, configured to measure a Y-axis magnetic field parallel to the surface of the substrate,
wherein the planar Hall sensor is configured to measure a magnetic field perpendicular to the substrate surface, and
wherein the first vertical Hall sensor and the second vertical Hall sensor are configured to be disposed adjacent to the planar Hall sensor.

14. The semiconductor device of claim 11, wherein the one or more first N-type contact regions are disposed to extend outward beyond a first boundary and a second boundary of the first N-type sensing region to a surface of the semiconductor substrate.

15. The semiconductor device of claim 11, wherein the plurality of third trenches are disposed to be in contact with the one or more second N-type contact regions.

16. A semiconductor device, comprising:
a vertical Hall sensor disposed on a substrate; and
a planar Hall sensor disposed on the substrate;
wherein the vertical Hall sensor comprises:
a plurality of P-type contact regions;
at least one N-type contact region; and
a first dummy contact region and a second dummy contact region respectively disposed at a first end and a second end of the at least one N-type contact region;
wherein a width of each of the at least one N-type contact region is less than a width of each of the plurality of P-type contact regions, and
wherein each of the plurality of P-type contact regions is configured to have a same width as each other.

17. The semiconductor device of claim 16, further comprising:
at least one first trench disposed at a first end of at least one of the plurality of P-type contact regions, and
second trenches disposed to surround each of the at least one N-type contact region.

18. The semiconductor device of claim 17, wherein a width of the at least one first trench is greater than a width of each of the second trenches.

19. The semiconductor device of claim 17, further comprising a N-type sensing region disposed on the substrate,
wherein the at least one N-type contact region is disposed to extend outward beyond a first boundary and a second boundary of the N-type sensing region to a surface of the substrate.

* * * * *